United States Patent
Christensen et al.

(10) Patent No.: US 7,619,867 B2
(45) Date of Patent: Nov. 17, 2009

(54) CONFORMAL COATING ENHANCED TO PROVIDE HEAT DETECTION

(75) Inventors: Dale Larry Christensen, Oronoco, MN (US); Joseph Paul Kuczynski, Rochester, MN (US); Nicholas Alexander Poleschuk, Jr., Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 1688 days.

(21) Appl. No.: 10/268,738

(22) Filed: Oct. 10, 2002

(65) Prior Publication Data

US 2004/0074651 A1    Apr. 22, 2004

(51) Int. Cl.
H02H 5/04    (2006.01)
G08B 17/10    (2006.01)

(52) U.S. Cl. .................................. 361/103; 340/632

(58) Field of Classification Search ................ 361/103; 73/23.2; 340/632
See application file for complete search history.

(56) References Cited

U.S. PATENT DOCUMENTS

| | | | |
|---|---|---|---|
| 3,720,935 A * | 3/1973 | Tomlin, Jr. ................ | 340/531 |
| 3,781,838 A | 12/1973 | Primmer | |
| 4,088,986 A | 5/1978 | Boucher | |
| 4,270,613 A | 6/1981 | Spector et al. | |
| 4,499,952 A | 2/1985 | Spector et al. | |
| 4,583,597 A | 4/1986 | Spector et al. | |
| 4,650,750 A | 3/1987 | Giese | |
| 4,683,463 A | 7/1987 | Kimura | |
| 4,717,902 A * | 1/1988 | James ....................... | 337/32 |
| 4,745,796 A | 5/1988 | Abdelrahman et al. | |
| 5,163,517 A | 11/1992 | Kozai et al. | |
| 5,280,273 A | 1/1994 | Goldstein | |
| 5,394,934 A | 3/1995 | Rein et al. | |
| 5,469,369 A | 11/1995 | Rose-Pehrsson et al. | |
| 5,650,560 A | 7/1997 | Troost | |
| 5,728,927 A | 3/1998 | Ong | |

(Continued)

FOREIGN PATENT DOCUMENTS

DE    20213498 U1 *    11/2002

(Continued)

*Primary Examiner*—Ronald W Leja
(74) *Attorney, Agent, or Firm*—Steven W. Roth; Roy W. Truelson

(57) ABSTRACT

Disclosed is an enhanced conformal coating, a process for making the same, and several computer related applications. A commercially available conformal coating is combined with a commercially available blowing agent (sometimes called a "foaming agent") to create an enhanced conformal coating. The formulation of the enhanced coating is such that it will emit a particular gas when heated to a particular temperature. The enhanced coating is then applied to an object to which pre-damage heat detection is desired. A sensor, located proximate to the object, is then used to detect the emitted gas. Once the gas is detected, actions can be taken to reduce the heat in a manner appropriate for the particular object. Application of the enhanced coating within the computer industry can involve its use with a particular electrical component or a group of electrical components (e.g., a circuit board). For example, the enhanced coating can be applied to one or more circuit boards. The coated boards and an appropriate gas sensor are then installed in a computer system housing. When the sensor detects a particular gas, it conveys information to the system regarding the possibility of excess heat. The system can then take remedial action.

15 Claims, 4 Drawing Sheets

U.S. PATENT DOCUMENTS

| | | |
|---|---|---|
| 5,808,541 A | 9/1998 | Golden |
| 5,830,412 A | 11/1998 | Kimura et al. |
| 5,841,021 A | 11/1998 | De Castro et al. |
| 5,874,314 A | 2/1999 | Loepfe et al. |
| 5,934,379 A | 8/1999 | Ostlyngen et al. |
| 5,945,924 A | 8/1999 | Marman et al. |
| 5,985,060 A | 11/1999 | Cabrera et al. |
| 6,098,523 A * | 8/2000 | Warburton ................ 73/1.03 |
| 6,104,301 A | 8/2000 | Golden |
| 6,125,710 A | 10/2000 | Sharp |
| 6,166,647 A | 12/2000 | Wong |
| 6,181,250 B1 * | 1/2001 | Brooks, Jr. ................ 340/577 |
| 6,230,545 B1 | 5/2001 | Adolph et al. |
| 6,237,397 B1 | 5/2001 | Shinar et al. |
| 6,287,765 B1 | 9/2001 | Cubicciotti |
| 7,080,545 B2 * | 7/2006 | Dimeo et al. ............ 73/31.05 |

FOREIGN PATENT DOCUMENTS

| | | |
|---|---|---|
| JP | 05-262986 | 10/1993 |
| JP | 06-308065 | 11/1994 |

\* cited by examiner

CONFORMAL COATING ENHANCED TO PROVIDE HEAT DETECTION

FIELD OF THE INVENTION

The present invention relates to conformal coatings and heat detection systems.

BACKGROUND OF THE INVENTION

Temperature control of physical objects has always been an important consideration. When certain objects get too cold they become brittle and crack and crumble. Similarly, certain objects melt or catch fire when they are subjected to excess heat. Of course, a heat-damaged object that is melted or charred is in most cases valueless. This patent pertains to a heat detection system that can be used to prevent damage to objects from excess heat.

An electrical component is perhaps one of the best examples of a heat sensitive object. This is not surprising given that heat is a natural by product of an electrical component's operation. If there is too much electrical current driving the component, the component can melt or catch fire. Similar damage occurs when the operational environment of the component does not dissipate enough heat. Said another way, electrical components can also be damaged by heat when they are placed too close together, when they are contained within a housing that restricts needed airflow, or when the ambient temperature (i.e., because of exposure to the sun or some other heat source) becomes too great.

A typical computer system, chocked full of expensive electrical components, clearly represents one of the best examples of the need for excess heat detection. This is especially so when one recalls that marketplace forces work to continually pressure computer system makers to develop smaller, more powerful computers. Of course, more power typically means more current, which (as mentioned) means more heat. Similarly, smaller computers involve more densely packed components (more heat) and less space (more heat). While all computer system design must, to some extent, account for heat issues, rack mounted super computers and blade servers represent two of the more challenging design points in that they involve densely packed system boards that are placed in close proximity to one another. Heat detection prior to component damage represents one of the more daunting impediments to improved system design.

Existing solutions tend to be limited in one of two ways. Solutions that provide pre-damage protection are limited to a specific component, set of components, or area. Solutions that provide a wider basis of detection are themselves limited by the fact that some damage, typically charring, must occur before excess heat can be detected.

Clearly a need exists for a heat detection system that provides wide-ranging detection prior to heat-induced damage.

SUMMARY OF THE INVENTION

Disclosed is an enhanced conformal coating, a process for making the same, and several computer related applications.

The enhanced conformal coating is formulated such that the coating will emit a particular gas when heated to a particular temperature. The enhanced coating is then applied to an object to which pre-damage heat detection is desired. A sensor, located proximate to the object, is then used to detect the emitted gas. Once the gas is detected, actions can be taken to reduce the heat in a manner appropriate for the particular object.

Application of the enhanced coating within the computer industry can involve its use with a particular electrical component or a group of electrical components (e.g., a circuit board).

DESCRIPTION OF THE PREFERRED EMBODIMENT

Figure 1:
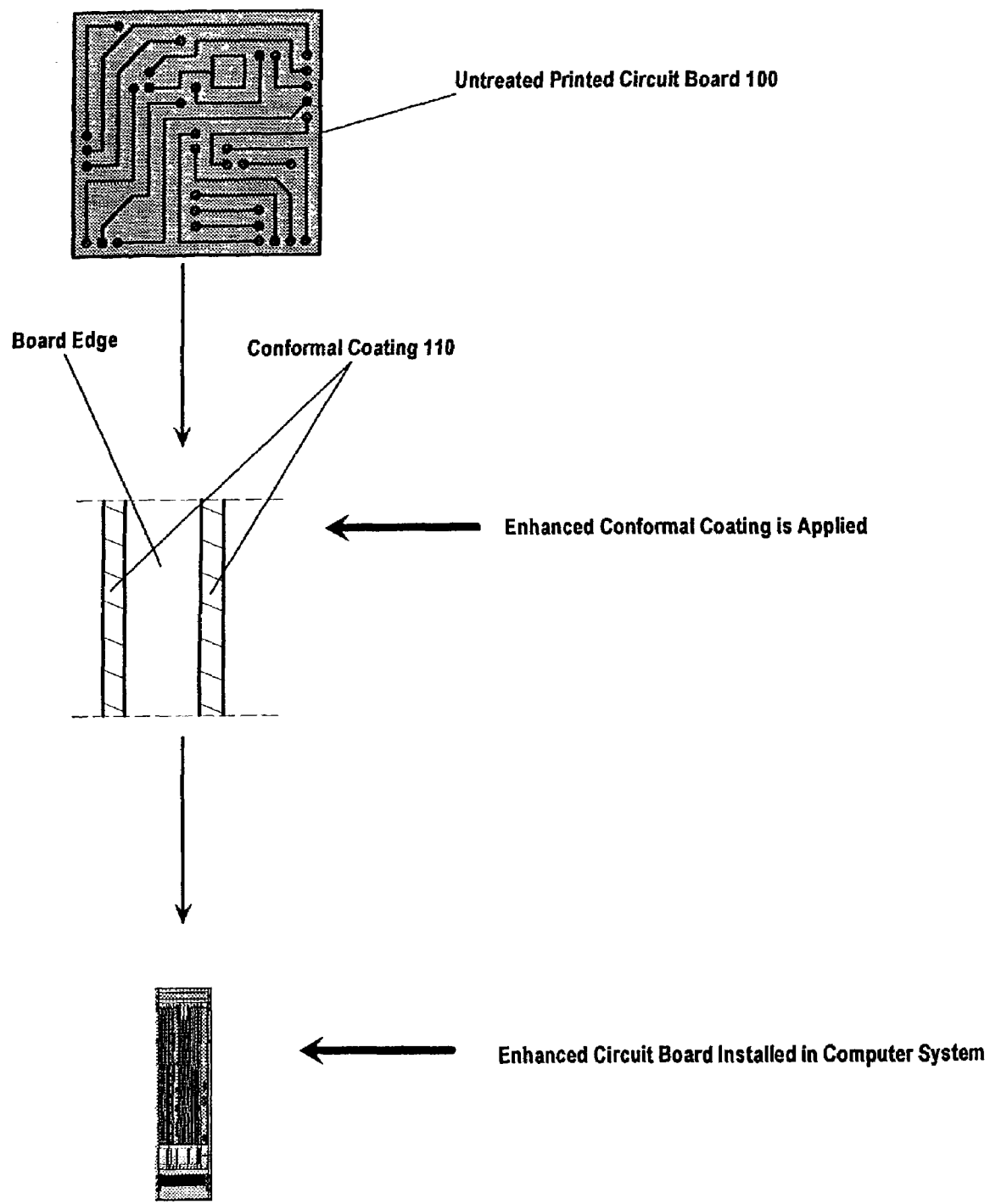
FIG. 1 is a high-level process diagram showing the enhanced conformal coating of the preferred embodiment being applied to a circuit board, which is then installed in a computer system.

Turning now to the drawings, FIGS. 1-5 are used to explain how the present invention can be used in the context of a computer system. However, it should be understood that the scope and teachings of the present invention are not limited to the context presented in the discussion of the preferred and alternate embodiments. Indeed, the teachings of the present invention can be applied to any sort of object for which heat detection is desired, no matter whether the object is an electrical component, a circuit board, or some other type of object for which heat detection is important. It is also important to note that reduction of heat is not the only purpose for with the teachings of present invention apply. For example, once a given level of heat is detected, it may be desirable in certain applications to increase the heating on the object, to increase the power to the object, reduce the power to the object, or terminate power to the object. With that said, FIG. 1 shows the enhanced conformal coating of the preferred embodiment being applied to a circuit board (i.e., an object), which is then installed in a computer system.

As shown, conformal coating 110 is applied to selected untreated circuit board 100. While not to scale, the cross section view of board 100 shows that conformal coating 110 is applied to both sides of board 100. In the preferred and alternate embodiments, conformal coating 110 is sprayed onto circuit board 100. However, the coating could be applied by brush, flow coating, or dipping.

Conformal coating 110 of the preferred and alternate embodiments has been enhanced to include a blowing agent. The blowing agent is formulated to outgas at a certain temperature. The following table shows how different coating/blowing agent formulations yield differing temperature sensitivities. Differing temperature sensitivity means that different enhanced coatings will outgas at different temperatures, making for a wide range of applications.

| Conformal Coating | Blowing Agent | By Weight Loading | OutGas Temperature |
|---|---|---|---|
| Polyurethane U-7510 | Celogen OT | 2-5% | 140° C. |
| Polyurethane U-7510 | Celogen AT | 2-5% | 190° C. |
| Polyurethane U-7510 | Celogen 754-A | 2-5% | 165-180° C. |
| Polyurethane U-7510 | Celogen 765-A | 2-5% | 152-160° C. |
| Polyurethane U-7510 | Celogen AZ | 2-5% | 190-220° C. |
| Polyurethane U-7510 | Celogen AZ 5100 | 2-5% | 210° C. |
| Polyurethane U-7510 | Celogen 780 | 2-5% | 140-150° C. |
| Polyurethane U-7510 | Celogen AZ-1901 | 2-5% | 205-213° C. |
| Polyurethane U-7510 | Celogen AZ-760-A | 2-5% | 200° C. |
| Polyurethane U-7510 | Celogen 9370 | 2-5% | 205-213° C. |
| Polyurethane U-7510 | Celogen AZNP-130 | 2-5% | 200° C. |
| Polyurethane U-7510 | Celogen AZRV | 2-5% | 200-210° C. |
| Polyurethane U-7510 | Celogen FF | 2-5% | 200° C. |
| Polyurethane U-7510 | Celogen TSH-C | 2-5% | 110-120° C. |
| Polyurethane U-7510 | Celogen RA | 2-5% | 228-235° C. |
| Shin_Etsu KE 3472T silicone | Celogen OT | 2-5% | 140° C. |
| Shin_Etsu KE 3472T silicone | Celogen AT | 2-5% | 190° C. |
| Shin_Etsu KE 3472T silicone | Celogen 754-A | 2-5% | 165-180° C. |
| Shin_Etsu KE 3472T silicone | Celogen 765-A | 2-5% | 152-160° C. |
| Shin_Etsu KE 3472T silicone | Celogen AZ | 2-5% | 190-220° C. |
| Shin_Etsu KE 3472T silicone | Celogen AZ 5100 | 2-5% | 140-150° C. |
| Shin_Etsu KE 3472T silicone | Celogen 780 | 2-5% | 205-213° C. |
| Shin_Etsu KE 3472T silicone | Celogen AZ-1901 | 2-5% | 200° C. |
| Shin_Etsu KE 3472T silicone | Celogen AZ-760-A | 2-5% | 200-210° C. |
| Shin_Etsu KE 3472T silicone | Celogen 9370 | 2-5% | 205-213° C. |
| Shin_Btsu KE 3472T silicone | Celogen AZNP-130 | 2-5% | 200° C. |
| Shin_Btsu KE 3472T silicone | Celogen AZRV | 2-5% | 200-210° C. |
| Shin_Btsu KE 3472T silicone | Celogen FF | 2-5% | 200° C. |
| Shin_Btsu KE 3472T silicone | Celogen TSH-C | 2-5% | 110-120° C. |
| Shin_Btsu KE 3472T silicone | Celogen RA | 2-5% | 228-235° C. |

In the preferred and alternate embodiments Polyurethane U-7510 is used as the base coating and Celogen OT is used as the blowing agent. This combination yields an enhanced conformal coating that will outgas at 140° C. This temperature was selected because typical circuit boards begin to loose mass at 250-300° C., which is well before char formation begins. It should be noted, however, that other formulations (as shown in the above table) could be used for applications that require different temperature sensitivity levels.

Finishing the description of FIG. 1, the circuit board, now enhanced with conformal coating 110, is installed into a computer system after an appropriate drying period (2-3 hours at 20° C. or 1 hour at 80° C.).

Figure 2A:
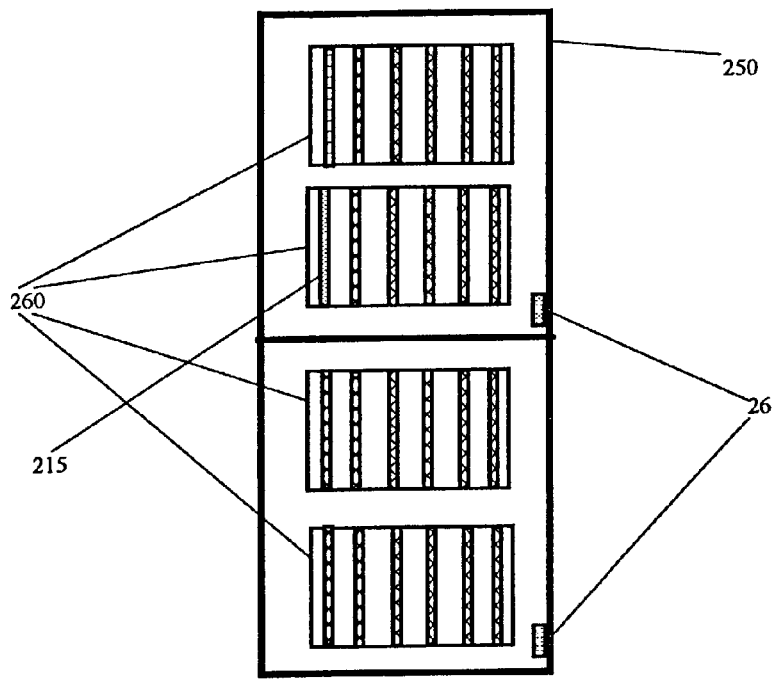
FIG. 2A is a physical diagram showing the enclosure and board-based components used in the computer system of the preferred embodiment of the present invention.

FIG. 2A is a physical diagram showing the enclosure and board-based components used in the computer system of the preferred and alternate embodiments of the present invention. As shown, computer system enclosure 250 includes a plurality of cages 260, which have mounted therein a plurality of boards. Two gas sensors 265 are also mounted within enclosure 250 to be in direct flow of cooling air. Model CS-200 microscale mass spectrometers, made by Mass Sensors Inc, are the gas sensors used in the preferred and alternate embodiments. However, it should be understood that other types of sensors, with similar capabilities, could also be used. When gas is detected by sensors 265, related information is shared with service processor 215. In the preferred and alternate embodiments, this information is shared using RS232 interfaces on sensors 265 and service processor 215.

Figure 2B:
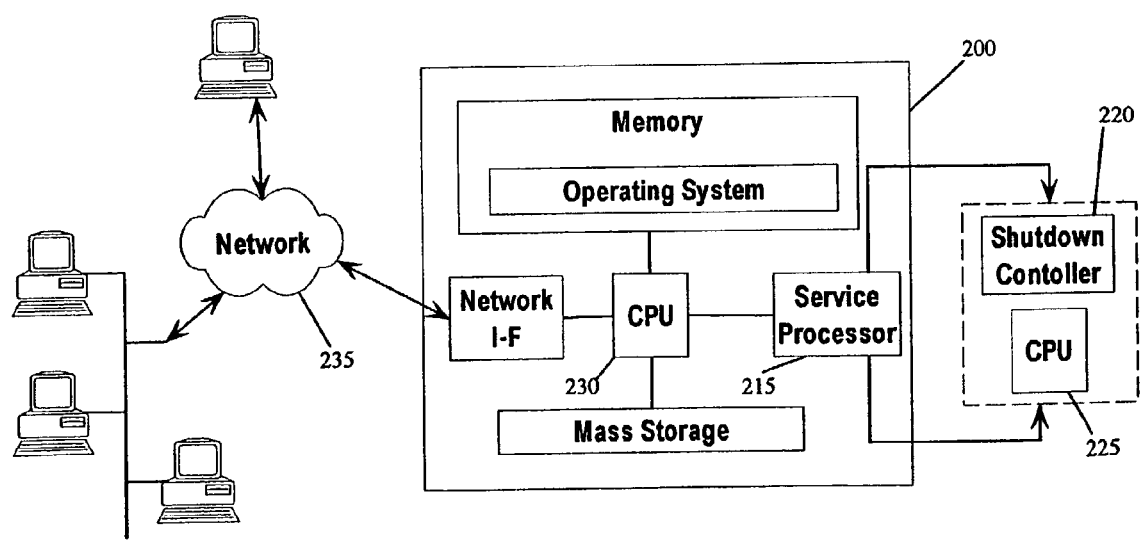
FIG. 2B is a logical diagram showing the operational components used in the computer system of the preferred embodiment of the present invention.

FIG. 2B shows some of the operational components used in the computer system of the preferred embodiment of the present invention. Computer system 200 is an enhanced IBM computer system, although other, similarly configured computer systems could be used. Depicted components include central processing unit (CPU) 230, service processor 215, and network 235. Shown within service processor 215 is shutdown controller 220, which executes on service processor CPU 225. Various embodiments of shutdown controller 220 are explained and described in FIGS. 3-5 and the accompanying text. It is important to note, though, that while shutdown controller 220 is shown to reside and execute on service processor 215, it could also, in a different configuration, operate on CPU 230 or on a network attached system like those attached to network 235. It should further be understood that while the embodiments of the present invention are being described herein in the context of a complete system, certain program mechanisms, such as shutdown controller 220, are capable of being distributed in program product form. Of course, it is well understood that a program product can be distributed on different types of signal bearing media, including, but not limited to: recordable-type media such as floppy disks and CD ROMs; and transmission-type media such as digital and analog communications links.

Figure 3:
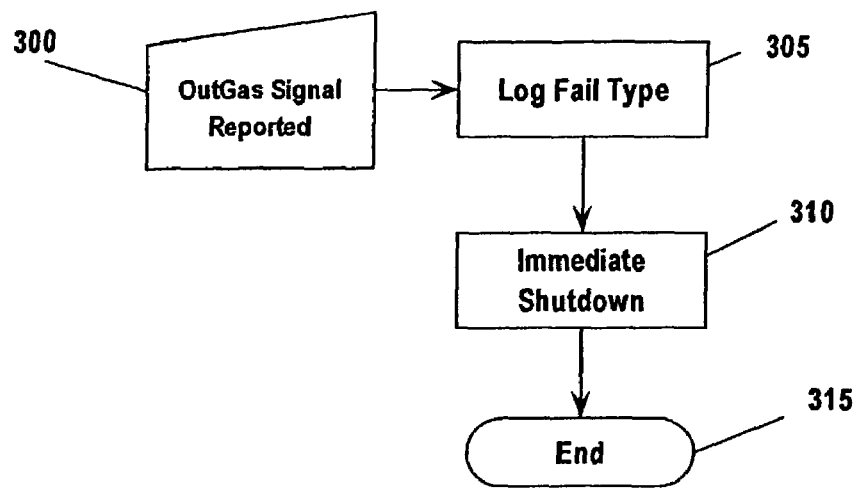
FIG. 3 is a flow diagram showing the steps used to carry out a first embodiment of a shutdown controller.

FIG. 3 shows the steps used to carry out a first embodiment of shutdown controller 220. The presence of gas within enclosure 250 indicates that one or more of the boards mounted in cages 260 is becoming hot to the point of impending damage. When one of sensors 265 detects this gas, it uses its RS232 port to send an alert (e.g., a notification) to service processor 215. This alert is received by shutdown controller 220 in block 300 of FIG. 3. Shutdown controller 220 then logs the type of system failure (i.e., heat in this case) [block 305], initiates immediate shutdown processing for system 200 [block 310], and terminates execution in block 315.

Figure 4:
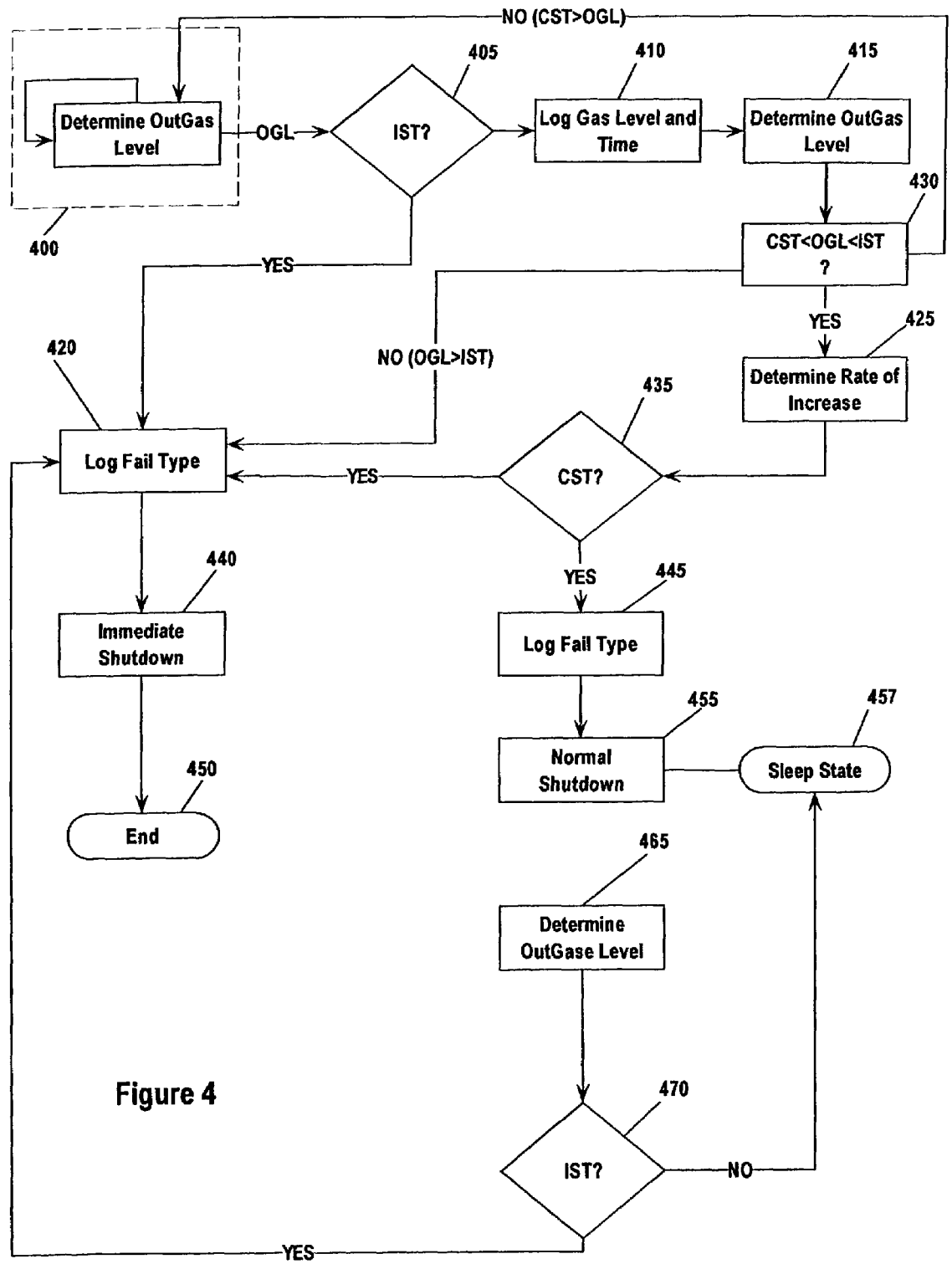
FIG. 4 is a flow diagram showing the steps used to carry out a second embodiment of a shutdown controller.

FIG. 4 shows the steps used to carry out a second embodiment of shutdown controller 220. In block 400, shutdown controller 220 repeatedly communicates with sensors 265 to determine the outgas level within enclosure 250. (The dashed outline of block 400 of FIG. 4 is explained in the ensuing discussion of FIG. 5.) When a non-zero outgas level is detected, shutdown controller 220 determines whether the detected outgas level exceeds an immediate shutdown threshold (IST). A detected gas level in excess of the IST requires quick action on the part of system 200 to avoid damage to one or more of the boards housed within enclosure 250. If the detected gas level does exceed the IST, shutdown controller 220 proceeds with an immediate shutdown of system 200. Immediate shutdown processing is the same as that described earlier in connection with FIG. 3. That is, shutdown controller 220 logs the fail type (i.e., heat) in block 420, initiates the immediate shutdown processing of system 200 [block 440], and terminates execution in block 450.

If in block 405 shutdown controller 220 determines that the outgas level is less than the IST, shutdown controller 220 logs the gas level and the time of the sampling in block 410. Shutdown controller 220 then again determines the outgas level through communication with sensors 265 [block 415]. In block 430, shutdown controller 220 determines whether the outgas level is greater than a controlled shutdown threshold (CST), but less than the IST. If the outgas level is greater than the IST, shutdown controller 220 proceeds with immediate shutdown processing [block 420].

If the outgas level is less than the CST, shutdown controller starts processing anew in block 400. If the outgas level is greater than the CST, but less than the IST, shutdown controller 220 knows that a shutdown is necessary, but that it may be possible to shutdown system 200 in an orderly manner. (Normal shutdown processing is the preferred alternative because it permits program executing on CPU 230 to complete processing and save data before being terminated.) Therefore, in block 425, shutdown controller 220 first determines the rate of increase between samples (i.e., between the outgas level detected in block 400 and the outgas level detected in block 415). Knowing how long a controlled shutdown of system 200 takes, shutdown controller 220 determines whether the rate at which the outgas level is increasing is sufficiently slow to permit a controlled shutdown of system 200 [block 435]. If shutdown controller 220 determines that there is not sufficient time to permit a controlled shutdown of system 200, shutdown controller 220 proceeds with immediate shutdown processing [block 420]. If shutdown controller 220 determines that there is sufficient time to permit a controlled shutdown of system 200, shutdown processor 220 logs the fail type in block 445, initiates normal shutdown processing in block 455, and enters a sleep state in block 457.

During normal shutdown processing, shutdown controller 220 periodically wakes up and checks the outgas level to determine whether the outgas level exceeds the IST. If the outgas level does exceed the IST, shutdown controller 220 knows that the overheating has now become critical, making an immediate shutdown necessary. Shutdown controller 220 then initiates immediate shutdown processing [block 420]. If shutdown controller 220 determines that the outgas level has not yet reached the IST, shutdown controller 220 knows that normal shutdown processing can be allowed to continue. Thus, shutdown controller 220 re-enters sleep state in block 457. Shutdown controller 220 then repeatedly executes blocks 465, 470, and 457 until normal shutdown processing completes, thereby terminating execution of shutdown controller 220 within service processor 215, or until shutdown controller 220 determines that immediate shutdown processing is necessary due to an outgas level in excess of the IST.

Figure 5:
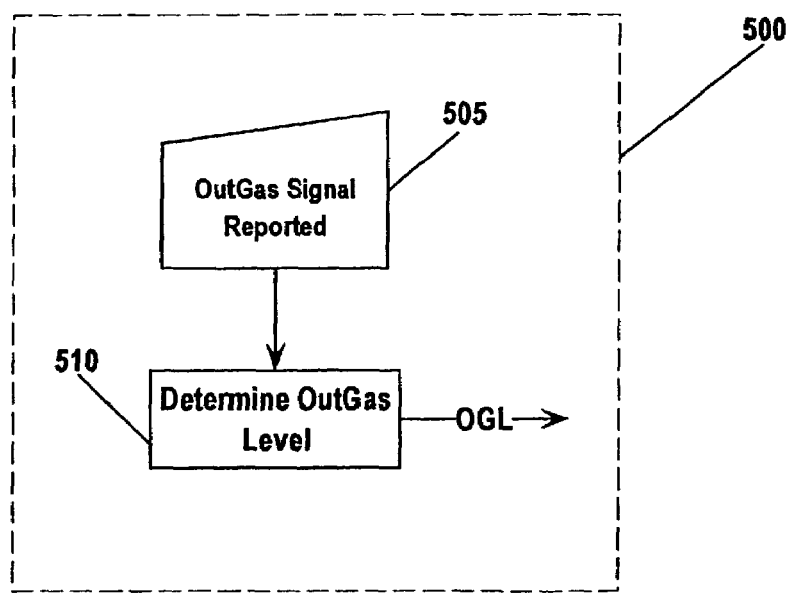
FIG. 5 is a flow diagram showing the steps used in connection with some of the steps shown in FIG. 4 to carry out the preferred embodiment of a shutdown controller.

FIG. 5 shows steps used in connection with some of the steps shown in FIG. 4 to carry out the preferred embodiment of shutdown controller 220. In the preferred embodiment, dashed block 500 of FIG. 5 replaces dashed block 400 of FIG. 4. In this embodiment, sensors 265 are configured to report the presence of gas without having to be repeatedly queried by shutdown controller 220. Once an outgas signal is reported, the outgas level is determined in block 510, and processing continues as has been described in connection with FIG. 4.

The embodiments and examples set forth herein were presented in order to best explain the present invention and its practical application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed. Many modifications and variations are possible in light of the above teaching without departing from the spirit and scope of the following claims.

What is claimed is:

1. An article of manufacture, said article of manufacture comprising:
   an active electrical component which receives electrical power and generates heat to perform at least one data processing function during operation, said electrical component being coated with a conformal coating, said conformal coating being formulated to emit a particular gas at a particular temperature, said particular temperature being substantially lower than a lowest temperature causing irreversible damage to a capability of said active electrical component to perform said at least one data processing function, said particular gas being detectable by a detection mechanism to take corrective action to reduce the temperature of said active electrical component before said irreversible damage to a capability of said active electrical component to perform said at least one data processing function occurs.

2. The article of manufacture of claim 1 wherein said electronic component is a circuit board.

3. The article of manufacture of claim 2 wherein said electronic component is located proximate to a gas sensor of said detection mechanism.

4. The article of manufacture of claim 1 wherein said corrective action is selected from the group consisting of:
   cooling said electrical component;
   terminating power to said electrical component; and
   reducing power to said electrical component.

5. The article of manufacture of claim 4 wherein said electrical component is part of a computer system.

6. An apparatus, said apparatus comprising:
   at least one active electrical component which receives electrical power and generates heat to perform at least one data processing function of said apparatus during operation thereof, said electrical component being coated with a conformal coating, said conformal coating being formulated to emit a particular gas at a particular temperature, said particular temperature being substantially lower than a lowest temperature causing irreversible damage to a capability of said electrical component to perform said at least one function, said electronic component being located proximate to a gas sensor such that said gas sensor can detect said particular gas and signal a notification of the presence of said particular gas; and
   a processor; said processor being configured to receive said notification and to shutdown said apparatus before said irreversible damage to a capability of said electrical component to perform said at least one function occurs.

7. The apparatus of claim 6 wherein said processor is configured to determine, responsive to receiving said notification and using data from said gas sensor, whether a need for an immediate shutdown to prevent said irreversible damage exists; to perform an immediate shutdown responsive to determining that a need for an immediate shutdown to prevent said irreversible damage exists; and to perform a normal shutdown responsive to determining a need for an immediate shutdown to prevent said irreversible damage does not exist.

8. The method of claim 7 wherein said processor is further configured to:
   determine a first outgas level;
   determine a second outgas level;
   determine whether a rate of increase between said first outgas level and said second outgas level is sufficiently slow to permit a normal shutdown; and
   perform said normal shutdown when said rate of increase is sufficiently slow to permit said normal shutdown.

9. The apparatus of claim 6, wherein said apparatus is a computer system.

10. A program product, said program product comprising:
    a computer recordable medium; and
    a shutdown controller stored on said computer recordable medium, said shutdown controller being configured to monitor a gas sensor during operation of an apparatus having at least one active electrical component, said at least one active electrical component receiving electrical power and generating heat to perform at least one data processing function of said apparatus during operation thereof, said at least one active electrical component being coated with a conformal coating, said coating being formulated to emit a particular gas at a particular temperature, said particular temperature being substantially lower than a lowest temperature causing irreversible damage to a capability of said at least one active electrical component to perform said at least one function, said shutdown controller performing the following steps:
       receiving a notification of detection of said particular gas from said gas sensor; and
       shutting down said apparatus before said irreversible damage to a capability of said at least one active electrical component to perform said at least one function occurs, said shutting down step being responsive to receiving said notification.

11. The program product of claim 10 wherein said shutting down step comprises:
    determining, using data from said gas sensor, whether a need for an immediate shutdown to prevent said irreversible damage exists;
    performing an immediate shutdown responsive to determining that a need for an immediate shutdown to prevent said irreversible damage exists; and
    performing a normal shutdown responsive to determining a need for an immediate shutdown to prevent said irreversible damage does not exist.

12. The program product of claim 11 wherein said step of performing a normal shutdown further comprises the steps of:
    determining a first outgas level;
    determining a second outgas level;
    determining whether a rate of increase between said first outgas level and said second outgas level is sufficiently slow to permit a normal shutdown;
    performing said normal shutdown when said rate of increase is sufficiently slow to permit said normal shutdown.

13. A method for managing operation of an apparatus, said method comprising the following steps:
    operating at least one active electrical component of said apparatus, said at least one active electrical component receiving electrical power and generating heat to perform at least one data processing function of said apparatus during operation thereof, said at least one active electrical component being coated with a conformal coating, said coating being formulated to emit a particular gas at a particular temperature, said particular temperature being substantially lower than a lowest temperature causing irreversible damage to a capability of said at least one active electrical component to perform said at least one function;
    receiving a notification of detection of said particular gas from a gas sensor; and
    shutting down said apparatus before said irreversible damage to a capability of said at least one active electrical component to perform said at least one function occurs, said shutting down step being responsive to receiving said notification.

14. The method of claim 13 wherein said shutting down step comprises:
    determining, using data from said gas sensor, whether a need for an immediate shutdown to prevent said irreversible damage exists;
    performing an immediate shutdown responsive to determining that a need for an immediate shutdown to prevent said irreversible damage exists; and
    performing a normal shutdown responsive to determining a need for an immediate shutdown to prevent said irreversible damage does not exist.

15. The method of claim 14 wherein said step of performing a normal shutdown further comprises the steps of:
    determining a first outgas level;
    determining a second outgas level;
    determining whether a rate of increase between said first outgas level and said second outgas level is sufficiently slow to permit a normal shutdown; and
    performing said normal shutdown when said rate of increase is sufficiently slow to permit said normal shutdown.

* * * * *

UNITED STATES PATENT AND TRADEMARK OFFICE
CERTIFICATE OF CORRECTION

PATENT NO. : 7,619,867 B2 Page 1 of 1
APPLICATION NO. : 10/268738
DATED : November 17, 2009
INVENTOR(S) : Christensen et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 2168 days.

Signed and Sealed this

Twenty-sixth Day of October, 2010

David J. Kappos
*Director of the United States Patent and Trademark Office*